(12) United States Patent
Kronholz et al.

(10) Patent No.: US 8,513,080 B2
(45) Date of Patent: *Aug. 20, 2013

(54) REDUCING CONTAMINATION IN A PROCESS FLOW OF FORMING A CHANNEL SEMICONDUCTOR ALLOY IN A SEMICONDUCTOR DEVICE

(75) Inventors: Stephan Kronholz, Dresden (DE); Berthold Reimes, Dresden (DE); Richard Carter, Dresden (DE); Fernando Koch, Bitterfeld (DE); Gisela Schammler, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/237,265

(22) Filed: Sep. 20, 2011

(65) Prior Publication Data

US 2012/0009751 A1    Jan. 12, 2012

Related U.S. Application Data

(63) Continuation of application No. 12/915,216, filed on Oct. 29, 2010, now Pat. No. 8,048,748.

(30) Foreign Application Priority Data

Jan. 29, 2010   (DE) .......................... 10 2010 001 402

(51) Int. Cl.
*H01L 21/336*    (2006.01)

(52) U.S. Cl.
USPC .................................. 438/289; 257/E21.618

(58) Field of Classification Search
USPC .......................................................... 438/289
See application file for complete search history.

(56) References Cited

U.S. PATENT DOCUMENTS

| 6,617,226 B1 | 9/2003 | Suguro et al. ................. 438/481 |
| 2008/0111155 A1 | 5/2008 | Capasso et al. ............... 257/192 |

FOREIGN PATENT DOCUMENTS

| JP | 09148426 A | 6/1997 |
| JP | 2006108205 A | 4/2006 |

OTHER PUBLICATIONS

Widmann et al., "Technologic hochintegrierter Schaltungen," Spring, pp. 18, 19, 27, 1996.
Translation of Official Communication from German Patent Office for German Patent Application No. 10 2010 001 402.8 dated Nov. 17, 2010.

*Primary Examiner* — William D Coleman
(74) *Attorney, Agent, or Firm* — Williams, Morgan & Amerson, P.C.

(57) ABSTRACT

In sophisticated approaches for forming high-k metal gate electrode structures in an early manufacturing stage, a threshold adjusting semiconductor alloy may be deposited on the basis of a selective epitaxial growth process without affecting the back side of the substrates. Consequently, any negative effects, such as contamination of substrates and process tools, reduced surface quality of the back side and the like, may be suppressed or reduced by providing a mask material and preserving the material at least during the selective epitaxial growth process.

20 Claims, 7 Drawing Sheets

REDUCING CONTAMINATION IN A PROCESS FLOW OF FORMING A CHANNEL SEMICONDUCTOR ALLOY IN A SEMICONDUCTOR DEVICE

This is a continuation of application Ser. No. 12/915,216 filed Oct. 29, 2010 now U.S. Pat. No. 8,048,748.

BACKGROUND OF THE INVENTION

1. Field of the Invention

Generally, the present disclosure relates to sophisticated integrated circuits including advanced transistor elements that comprise gate structures including a metal-containing electrode and a high-k gate dielectric.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface defined by highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for a gate insulation layer that separates the gate electrode, frequently comprised of polysilicon, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively sealed transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, in high performance transistors, a channel length of approximately 0.08 μm may require a gate dielectric made of silicon dioxide as thin as approximately 1.2 nm. Although, generally, usage of high speed transistor elements having an extremely short channel may be restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$), strontium titanium oxide ($SrTiO_3$), hafnium oxide ($HfO_2$), HfSiO, zirconium oxide ($ZrO_2$) and the like.

When advancing to a sophisticated gate architecture based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, a conductive metal-containing non-polysilicon material, such as titanium nitride and the like, may be formed so as to directly connect to the high-k dielectric material, thereby substantially avoiding the presence of a depletion zone. Since the threshold voltage of the transistors is significantly affected by the work function of the gate electrode material that is in contact with the gate dielectric material, an appropriate adjustment of the effective work function with respect to the conductivity type of the transistor under consideration has to be guaranteed, as the well-established way of adjusting the work function by appropriately doping a polysilicon material is no longer available.

For example, appropriate metal-containing gate electrode materials, such as titanium nitride and the like, may frequently be used in combination with appropriate metal species, such as lanthanum, aluminum and the like, to adjust the work function to be appropriate for each type of transistor, i.e., N-channel transistors and P-channel transistors, which may, in some approaches, require an additional band gap offset for the P-channel transistor. For this reason, it has been proposed to appropriately adjust the threshold voltage of some transistor devices by providing a specifically designed semiconductor material at the interface between the gate dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes for adjusting the work function and thus the threshold voltages in a very advanced process stage.

It turns out, however, that the manufacturing sequence of forming the threshold adjusting semiconductor alloy may have a significant influence on the overall process flow, as will be described in more detail with reference to FIGS. 1a-1f.

FIG. 1a schematically illustrates a cross-sectional view of a semiconductor device 100 that comprises a substrate 101, above which is formed a silicon-based semiconductor material 102 having an appropriate thickness for forming therein and thereabove transistor elements. An isolation structure 102C is formed in the semiconductor layer 102 and laterally delineates and thus forms active regions 102A, 102B. In this context, an active region is to be understood as a semiconductor material in which an appropriate dopant profile is to be created in order to form PN junctions for one or more transistors. In the example shown, the active region 102A corresponds to a P-channel transistor, while the active region 102B corresponds to an N-channel transistor. Hence, the active regions 102A, 102B comprise an appropriate basic dopant concentration in order to determine the basic conductivity of a P-channel transistor and an N-channel transistor, respectively. Furthermore, in the manufacturing stage shown, a mask layer 103 is formed on the active regions 102A, 102B in the form of a silicon dioxide material. Furthermore, an etch mask 104 is provided such that the active region 102B is covered, while the active region 102A, i.e., the mask layer 103 formed thereon, is exposed to an etch ambient 105.

The semiconductor device 100 as illustrated in FIG. 1a may be formed on the basis of the following process strategies. The isolation structure 102C is formed on the basis of well-established lithography, etch, deposition, planarization and anneal techniques, in which, for instance, a trench is formed in the semiconductor layer 102 on the basis of a lithography process, which is subsequently filled with an appropriate insulating material, such as silicon dioxide, silicon nitride and the like. After removing any excess material and planarizing the surface topography, the processing is typically continued by performing a plurality of implantation sequences using an appropriate masking regime in order to introduce the required well dopant species for generating the basic dopant concentration in the active regions 102A, 102B in accordance with requirements of the transistors to be formed. After activating the dopant species and re-crystallizing implantation-induced damage, the processing is continued by forming the mask layer 103 on the basis of for instance, an oxidation process, followed by the deposition of a mask material, such as a resist material, that is subsequently patterned into the mask 104 by well-established lithography techniques. Next, the etch process 105 is performed, for instance using a wet chemical etch recipe based on hydrofluoric acid (HF), which is a very efficient chemical for removing silicon dioxide material selectively with respect to silicon material.

FIG. 1b schematically illustrates the semiconductor device 100 after the above-described process sequence and after removal of the etch mask 104 (FIG. 1a). The etch process 105 (FIG. 1a) is typically performed in an appropriate chemical reactor in which a plurality of substrates may be concurrently processed, wherein the wet chemical etch chemistry may also be provided at the back side (not shown) of the substrate 101, thereby also efficiently removing any oxide material which may have been formed upon providing the mask material 103. Upon exposure of the active region 102A, the device 100 may be prepared for a subsequent selective epitaxial growth process for forming a silicon/germanium alloy on the active region 102A.

FIG. 1c schematically illustrates the semiconductor device 100 when exposed to a further process ambient 106 upon preparing the device 100 for the selective epitaxial growth process. Typically, the process ambient 106 is established in the deposition reactor by applying elevated temperatures and appropriate reactive gas components in order to remove any further contaminants and oxide residues from the exposed surface areas of the active region 102A, which may still be present in the form of a native oxide and the like. During the process 106, a thickness of the mask layer 103 may be reduced, while nevertheless maintaining a significant portion so as to mask the active region 102B.

FIG. 1d schematically illustrates the semiconductor device 100 during a selective epitaxial growth process 108 in which process parameters are selected such that a significant material deposition is restricted to the exposed active region 102A, while a material deposition on a silicon dioxide surface area, such as the surface of the isolation structure 102C and the mask layer 103, is strongly suppressed. For this purpose, the flow rates, the pressure, the temperature and the like may be selected in accordance with well-established selective epitaxial growth recipes in order to obtain a desired high deposition selectivity with respect to silicon and silicon dioxide surfaces. Thus, during the selective epitaxial growth process 108, a silicon/germanium alloy 109 is selectively formed on the active region 102A, thereby providing a semiconductor material having a different band gap compared to the silicon-based material of the active region 102A. Generally, the material composition of the alloy 109, as well as the thickness thereof, has a strong influence on the finally obtained threshold voltage of the P-channel transistor to be formed in and above the active region 102A. For example, in sophisticated applications, a target thickness of the silicon/germanium alloy 109 is in the range of approximately 8-50 nm, wherein a thickness variation of several percent may result in a significant variability of the finally achieved transistor characteristics. Moreover, since the transistor characteristics may also be strongly influenced by the further processing, for instance by forming a high-k dielectric material in combination with a metal-containing electrode material, in particular when adjusting the critical work function of the resulting electrode material, any process irregularities, such as contamination and the like, may also significantly affect transistor performance and device uniformity.

FIG. 1e schematically illustrates the semiconductor device 100 when exposed to an etch ambient 110 in which the mask 103 (FIG. 1d) is removed selectively with respect to the active region 102B and selectively to the active region 102A, which may now comprise the threshold adjusting semiconductor alloy 109. The etch process may be performed on the basis of hydrofluoric acid, which may be applied in a chemical reactor, as discussed above, thereby efficiently removing silicon oxide-based material from the semiconductor layer 102 and any other exposed surface areas, such as the back side of the substrate 101 and the like.

FIG. 1f schematically illustrates the semiconductor device 100 in a further advanced manufacturing stage. As illustrated, a first gate electrode structure 160A is formed on the active region 102A, i.e., on the threshold adjusting semiconductor alloy 109, and comprises a gate dielectric material 161A in combination with a conductive metal-containing electrode material 162A. Moreover, a further electrode material 163, for instance in the form of a silicon material, may be provided, possibly in combination with a dielectric cap material 164. Similarly, a second gate electrode structure 160B is formed on the active region 102B and comprises a gate dielectric material 161B in combination with a metal-containing electrode material 162B. Furthermore, the gate electrode structure 160B may also comprise the electrode material 163 and the dielectric cap material 164. The gate electrode structures 160A, 160B may have a gate length, i.e., in FIG. 1f, the horizontal extension of the electrode materials 162A, 162B, respectively, which may be 50 nm and less, depending on the overall design requirements. Furthermore, it should be appreciated that the gate dielectric material 161A may basically have the same configuration as the gate dielectric material 161B, while, in some cases, an additional work function adjusting species, such as aluminum, lanthanum and the like, may be incorporated so as to provide the desired electronic characteristics of a transistor 150A or a transistor 150B, respectively. Similarly, the metal-containing electrode materials 162A, 162B may have basically the same configuration in some approaches, for instance these materials may be provided in the form of titanium nitride and the like, while, in other cases, a work function metal species may be incorporated therein so that the materials 162A, 162B may differ in their material composition so as to obtain a different desired work function for the transistors 150A, 150B.

The semiconductor device 100 as shown in FIG. 1f may be formed on the basis of a complex process sequence in which appropriate materials for the gate dielectric material 161A, 161B may be formed, for instance, by oxidation in combination with deposition techniques and the like. For example, a very thin silicon oxide based material may be provided so as to act as an efficient interface material, followed by a high-k dielectric material, such as hafnium oxide and the like. Thereafter, appropriate work function metal species may be deposited and patterned, possibly in combination with any heat treatment for diffusing appropriate species towards and into the dielectric material, thereby forming the gate dielectric layers 161A, 161B having included therein different types of work function species. In other cases, the work function metals may be provided as distinct layers above the gate dielectric materials and may thus represent a portion of the metal-containing electrode materials 162A, 162B. Thereafter, the electrode material 163 may be deposited, for instance, in the form of amorphous silicon and the like, followed by the deposition of the dielectric cap material 164, possibly in combination with other materials, such as hard mask materials, anti-reflective coating (ARC) materials and the like. Next, the complex gate layer stack may then be patterned by applying sophisticated lithography and etch techniques in order to obtain the gate electrode structures 160A, 160B. It should be appreciated that the finally achieved electronic characteristics of the gate electrode structures 160A, 160B may depend on the material composition of the various material and the uniformity of the corresponding deposition, lithography and etch processes.

Thereafter, the processing is continued by forming drain and source regions, which may be preceded by the incorporation of a strain-inducing semiconductor alloy in one or both of the active regions 102A, 102B, if required. The drain and source regions may typically be formed by ion implantation on the basis of an appropriate spacer structure to be formed on sidewalls of the gate electrode structures 160A, 160B. Finally, metal silicide regions may be formed in the drain and source areas and in the electrode material 163, thereby completing a basic transistor configuration using the sophisticated high-k metal gate electrode structures 160A, 160B. It turns out, however, that the resulting transistor elements 150A, 150B may suffer from an increased variability in transistor characteristics, such as threshold variability and the like, which may thus significantly reduce production yield for sophisticated semiconductor devices requiring a high-k metal gate electrode structure.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which superior uniformity may be achieved upon forming a high-k metal gate electrode structure in an early manufacturing phase. Without intending to restrict the present application to the following explanation, it is assumed that material deposition on the back side of a substrate, in particular during a selective epitaxial growth process for forming a threshold adjusting semiconductor alloy, may have a significant influence on the overall uniformity of the resulting gate electrode structures and thus transistors. It has been observed that, at least near the edge of the substrate, a semiconductor alloy, such as a silicon/germanium material, may also be formed at the back side of the substrate, which may result in a certain contamination of process tools and substrates, which may have an influence on the further processing, in particular when forming sensitive materials, such as the high-k dielectric material in combination with any work function metal species and the amorphous silicon material prior to actually patterning the gate electrode structures. Consequently, when depositing the threshold adjusting semiconductor alloy, such as a silicon/germanium material, on the substrate back side, a high probability may exist in dissolving germanium or any other undesired components during the various cleaning processes that may have to be implemented during the complex process sequence for adjusting an appropriate work function of the gate electrode structures. Thus, according to the principles disclosed herein, the deposition of a threshold adjusting semiconductor alloy at the back side may be efficiently suppressed by forming a mask on the basis of a deposition process, which may also efficiently form the mask material at the back side, and by preserving the mask material at the back side at least until completing the selective epitaxial growth process. Consequently, contamination of process tools and substrates may be reduced and also the back side characteristics, such as surface roughness, may be improved by preserving an efficient mask material on the back side throughout at least some of the critical process steps when forming the threshold adjusting semiconductor alloy and providing sensitive materials of the high-k metal gate electrode structures.

One illustrative method disclosed herein comprises forming a first active region and a second active region in a semiconductor layer of a semiconductor device, wherein the semiconductor layer is formed on a substrate having a back side. The method further comprises forming a mask layer above the first and second active regions and above the back side. Furthermore, the mask layer is removed selectively from the first active region while preserving the mask layer above the second active region and the back side. The method additionally comprises forming a threshold adjusting semiconductor alloy selectively on the first active region while using the preserved mask layer as a mask. Additionally, the mask layer is removed from the second active region. Moreover, a first gate electrode structure of a first transistor is formed on the threshold adjusting semiconductor alloy that is formed on the first active region and a second gate electrode structure of a second transistor is formed on the second active region, wherein the first and second gate electrode structures comprise a high-k dielectric gate insulation layer and a metal-containing gate electrode material.

A further illustrative method disclosed herein comprises forming an oxide layer above a first active region and a second active region of a semiconductor device, wherein the first and second active regions are formed in a semiconductor layer that is formed above a substrate of the semiconductor device. The method further comprises removing the oxide layer selectively from the first active region by exposure to a reactive etch ambient, while masking the oxide layer above the second active region and avoiding exposure of the back side of the substrate to the reactive etch ambient. Moreover, a threshold adjusting semiconductor alloy is formed on the first active region while using the oxide layer above the second active region as a mask. Additionally, the oxide layer is removed from above the second active region. The method further comprises forming a first gate electrode structure of a first transistor on the threshold adjusting semiconductor alloy and forming a second gate electrode structure of a second transistor on the second active region, wherein the first and second gate electrode structures comprise a high-k dielectric gate insulation layer and a metal-containing gate electrode material.

A still further illustrative method disclosed herein comprises providing a semiconductor region formed above a front side of a substrate which comprises a back side arranged opposite to the front side. The method further comprises forming a mask layer above the semiconductor region and above the back side. Furthermore, the method comprises removing the mask layer selectively from the semiconductor region and preserving at least a portion of the mask layer above the back side so as to cover the back side. Additionally, the method comprises forming a semiconductor alloy selectively on the semiconductor region while using the at least a portion of the mask layer as a growth mask. Moreover, a gate electrode structure is formed on the semiconductor alloy by providing a gate dielectric layer including a high-k dielectric material and by providing a metal-containing material formed on the gate dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
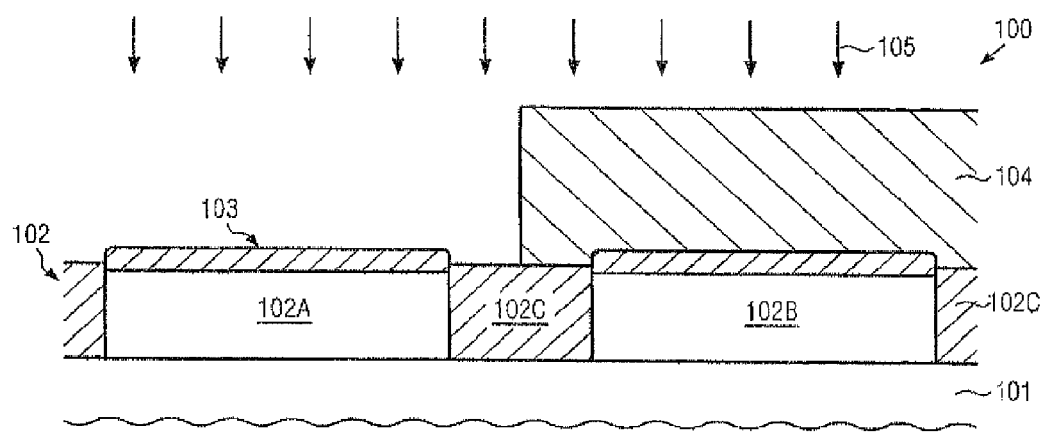
FIGS. 1a-1f schematically illustrate cross-sectional views of a semiconductor device during various manufacturing stages in forming a high-k metal gate electrode structure in an early manufacturing phase according to sophisticated process strategies, without taking into consideration a material deposition on the back side of a substrate, according to conventional approaches.
Figure 1B:
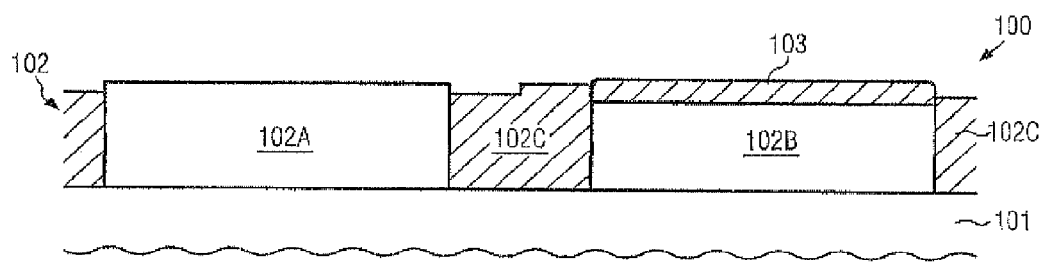
Figure 1C:
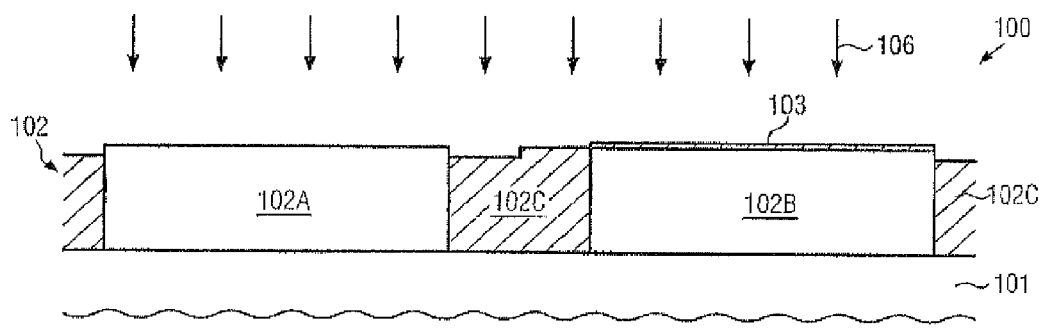
Figure 1D:
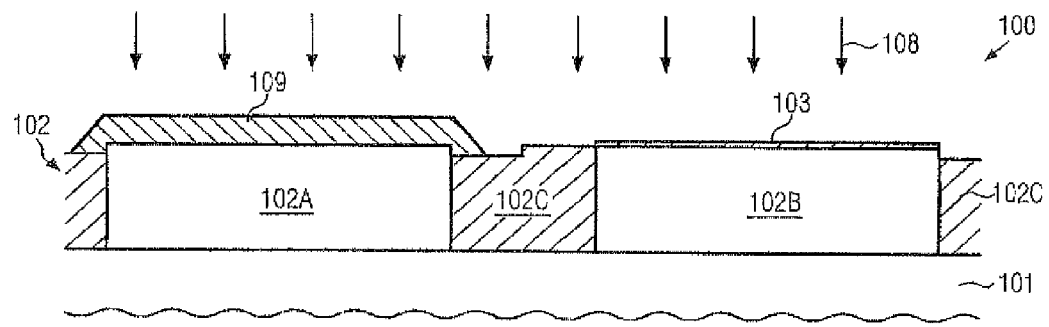
Figure 1E:
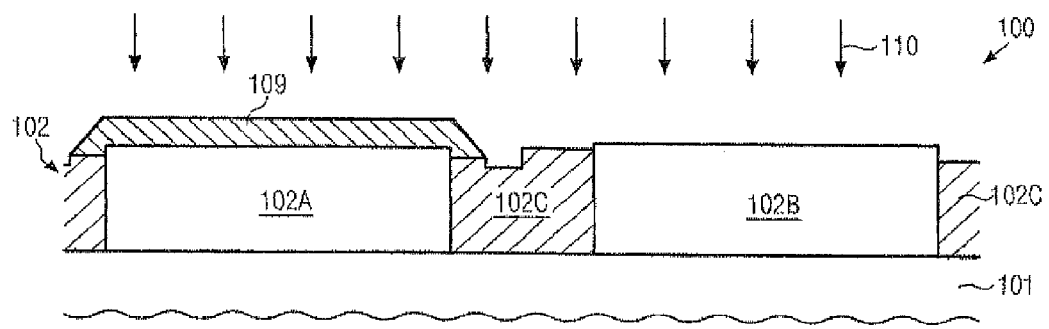
Figure 1F:
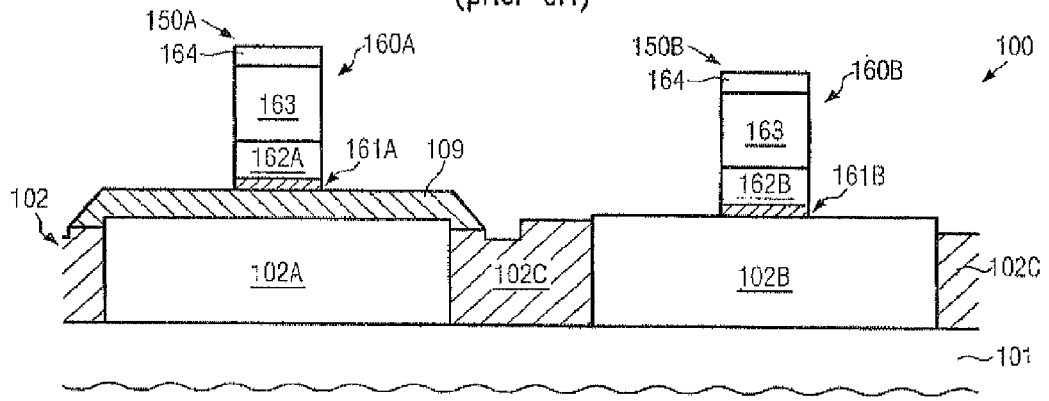

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which superior process conditions may be established in the complex manufacturing sequence for providing high-k metal gate electrode structures in combination with a threshold adjusting semiconductor alloy that is to be formed at least in one type of transistor. Without intending to restrict the present application to any theory, it is believed that a superior back side surface characteristics, in combination with avoiding significant deposition of the threshold adjusting semiconductor alloy, may contribute to superior uniformity of the resulting complex high-k metal gate electrode structure, as will be explained with reference to FIGS. 1g and 1h.

Figure 1G:
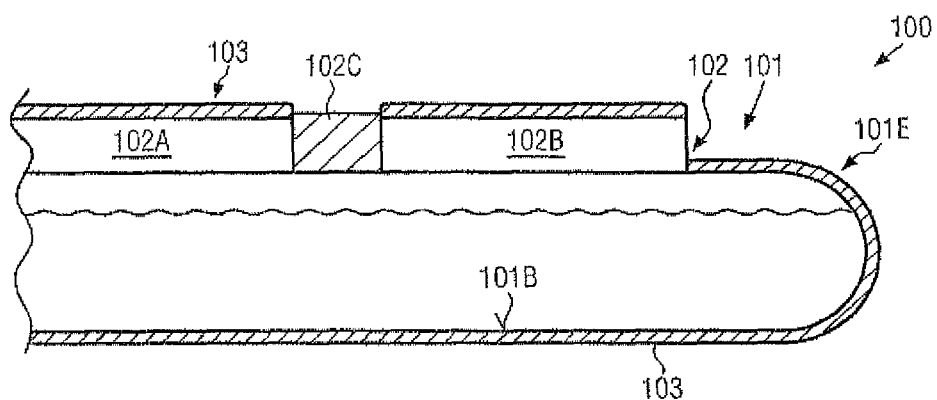
FIGS. 1g-1h schematically illustrate cross-sectional views of an edge region of a substrate prior to and after forming a threshold adjusting semiconductor material according to conventional strategies, wherein according to the principles disclosed herein, it is believed that a material deposition may have an influence on the further processing.

FIG. 1g schematically illustrates a cross-sectional view of the semiconductor device 100, as is also previously described with reference to FIGS. 1a-1f. As shown, the active regions 102A, 102B may be positioned close to an edge region 101E of the substrate 101. It should be appreciated, however, that the dimensions of the active regions 102A, 102B and of the substrate 101 are not true to scale in view of simplifying the illustration. In the manufacturing stage shown, the mask layer 103, for instance in the form of an oxide material, may be formed on the active regions 102A, 102B, as previously explained. Typically, the mask material 103 is formed on the basis of an oxidation process in which exposed portions of the substrate 101 may also be oxidized, thereby also forming the mask layer 103 on a back side 101B of the substrate 101. As described above with reference to FIG. 1a, upon removing the mask layer 103 selectively from the active region 102A, a resist mask, such as the resist mask 104 of FIG. 1a, is provided and thus covers the active region 102B while also exposing the back side 101B. Consequently, during the subsequent wet chemical etch process based on hydrofluoric acid in a typical wet chemical etch reactor, any exposed oxide materials may be etched, thereby also removing the mask layer 103 from the back side 101B. Similarly, during the subsequent treatment, as for instance described with reference to FIG. 1c, any oxide residues may be efficiently removed from the back side and the edge region 101E.

Figure 1H:
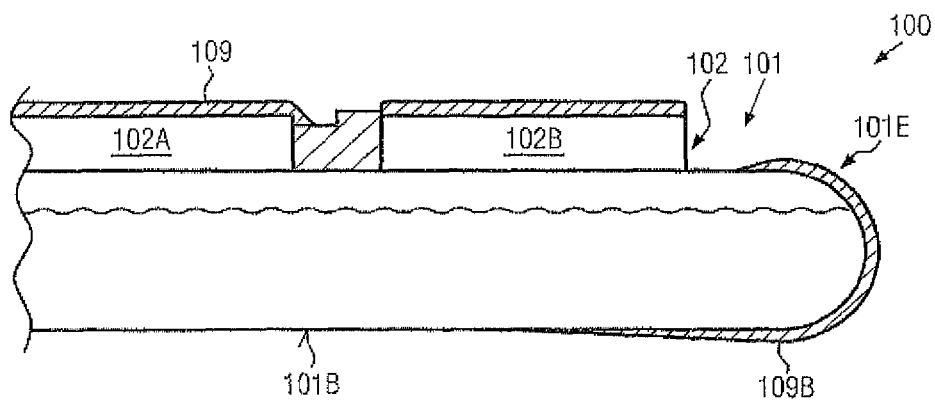

FIG. 1h schematically illustrates the semiconductor device 100 after the selective epitaxial growth process for forming the semiconductor alloy 109 on the active region 102A, as described above. Consequently, due to the preceding treatment, material 109B may also be deposited, at least partially, on the substrate 101, for instance around the edge region 101E and a portion of the back side 101B. The degree of material growth may, however, significantly depend on tool and process specific aspects, such as a certain degree of tilt of the substrate 101 when being placed in the growth reactor, the selected temperature during the pre-treatment and the actual deposition, which may cause a more or less pronounced degree of substrate bending, and the like. Consequently, during the further processing of the device 100, which may require a plurality of cleaning processes for depositing and patterning the complex material system of the gate electrode structures, the material 109B may be dissolved or released to a more or less pronounced degree, depending on the overall amount of the material 109B, the substrate handling processes and tools, the cleaning recipes and the like. Thus, in particular during the very critical process steps for providing sensitive materials, contamination, for instance by germanium species, may occur in the process tools and thus in any substrates processed therein, wherein, also, generally, surface planarity and roughness may depend on the initial material growth, since the interaction of any cleaning substances with the back side 101B comprising the grown material 109B in a more or less amount may be different, thereby also contributing to reduced process uniformity, for instance during any heat treatments, while the degraded surface quality of the back side 101B in general may result in a less uniform handling of the substrates in any process tools.

The present disclosure therefore provides a process strategy for enhancing back side surface uniformity by providing a mask layer that may suppress the deposition or growth of a threshold adjusting semiconductor material. To this end, the mask material may be formed on the basis of a deposition process or any other treatment, such as oxidation, in which the mask layer may also be reliably formed on the back side of the substrate, while, on the other hand, the selective removal of the mask layer may be restricted to the front side, at least until the threshold adjusting semiconductor material has been formed above the front side of the substrate. For this purpose, appropriate etch strategies may be applied, for instance using plasma assisted etch processes, possibly in combination with a dual or a multi-layer mask material, while, in other illustrative embodiments, a wet chemical etch process may be applied on the basis of a single substrate process in which the front side and the back side of a substrate may be treated differently, thereby also efficiently avoiding the removal of the mask material at the back side prior to performing the selective epitaxial growth process.

With reference to FIGS. 2a-2h, further illustrative embodiments will now be described in more detail, wherein reference may also be made to FIGS. 1a-1h, in particular with reference to any process strategies for forming sophisticated gate electrode structures.

Figure 2A:
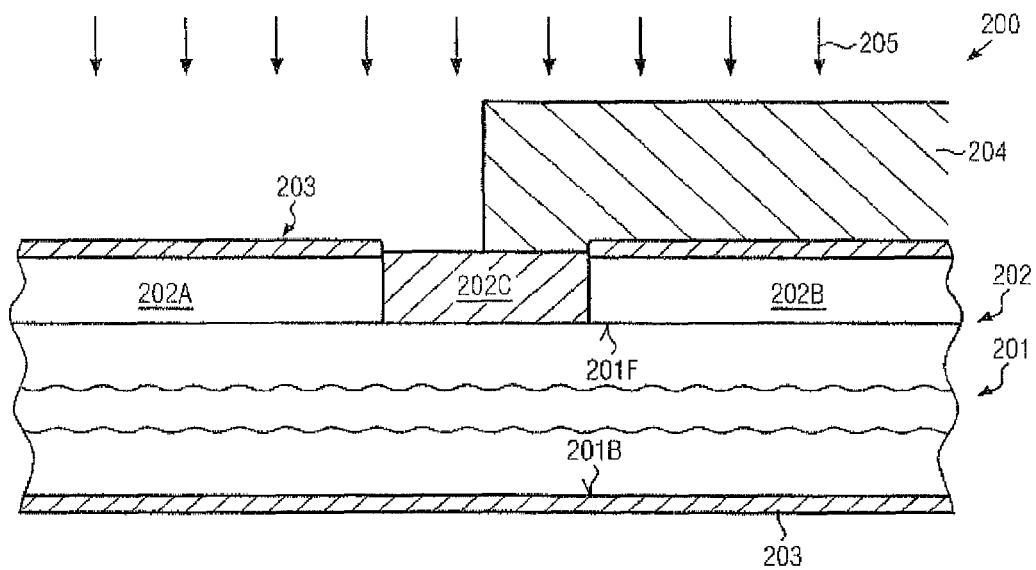
FIGS. 2a-2h, schematically illustrate cross-sectional views of a semiconductor device during various manufacturing stages in forming sophisticated high-k metal gate electrode structures on the basis of a threshold adjusting semiconductor alloy while avoiding or at least significantly reducing any deposition of the threshold adjusting semiconductor alloy at the back side, according to illustrative embodiments.

FIG. 2a schematically illustrates a semiconductor device 200 comprising a substrate 201 having a front side 201F and a back side 201B. A semiconductor layer 202 may be formed on or above the front side 201F and may be comprised of silicon material or any other semiconductor material which may require, at least locally, the provision of an appropriate semiconductor material or alloy for obtaining a desired difference in band gap, as is, for instance, also discussed above with reference to the semiconductor device 100. The semiconductor layer 202 may comprise active regions 202A, 202B, which may be laterally delineated by an isolation structure 202C. With respect to these components, the same criteria may apply as previously explained with reference to the semiconductor device 100. Furthermore, in the manufacturing stage shown, a mask layer 203 may be formed above the active regions 202A, 202B and above the back side 201B. It should be appreciated that the term "above" or any other related position statement may refer to a direction pointing away from an appropriate reference plane. For instance, with respect to the semiconductor layer 202 formed "above" the substrate 201, the front side 201F may represent an appropriate reference plane. Similarly, the mask material 203 may be formed "above" the back side 201B in the above-defined sense.

The mask layer 203 may be provided in the form of any appropriate material, such as silicon dioxide, silicon nitride and the like, which may be formed by any appropriate process technique that enables the forming of the layer 203 on or above the front side 201F and also on or above the back side 201B. For example, as previously discussed, silicon dioxide may represent an appropriate mask material so as to act as a growth mask during the further processing since a plurality of selective epitaxial growth recipes are available in which significant material deposition on a silicon dioxide material may be suppressed. In this case, the mask layer 203 may be formed on the basis of an appropriate oxidation process performed in a furnace and the like, wherein the front side and back side 201F, 201B are concurrently exposed to a process ambient. In other cases, the material 203 may be deposited in a furnace by chemical vapor deposition (CVD) techniques, wherein well-established process recipes are available.

Consequently, after forming the active regions 202A, 202B and the isolation structure 202C, for instance based on process techniques as described above with reference to the device 100, the mask layer 203 may be formed so as to cover the back side 201B. Thereafter, an etch mask 204, such as a resist mask, may be provided in order to cover the active region 202B and thus a portion of the layer 203 formed thereabove. Next, in one illustrative embodiment, a plasma assisted etch process 205 may be applied to remove material 203 selectively from the active region 202A. It should be appreciated that a plurality of plasma assisted etch recipes are available for removing silicon dioxide material, silicon nitride material and the like selectively with respect to a silicon material. Since the plasma assisted process 205 may be performed as a highly directional etch process, an influence on the back side 201B may be substantially suppressed, thereby preserving the material 203 formed above the back side 201B.

Figure 2B:
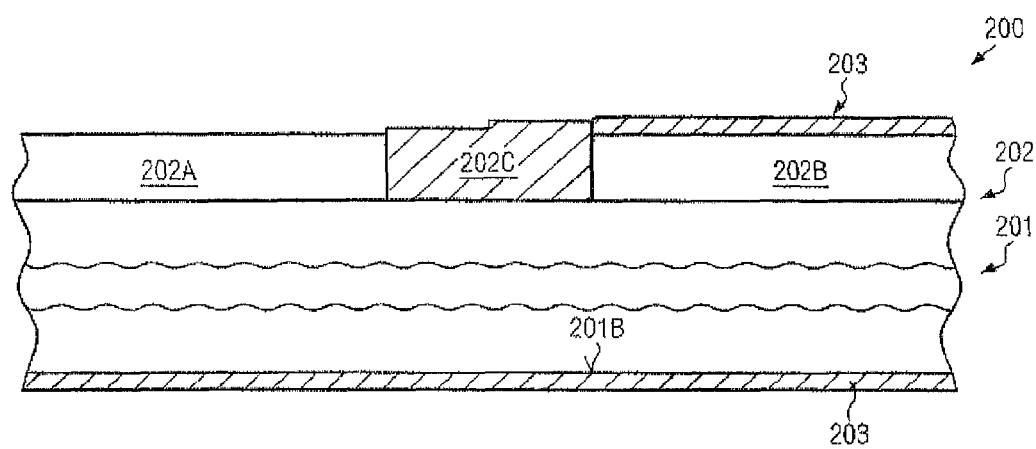

FIG. 2b schematically illustrates the semiconductor device 200 in a further advanced manufacturing stage, i.e., after the removal of the etch mask 204 (FIG. 2a). As illustrated, the active region 202B and the back side 201B are still covered by the mask material 203, while the active region 202A may be exposed and may thus be prepared for the subsequent deposition of a threshold adjusting semiconductor material.

Figure 2C:
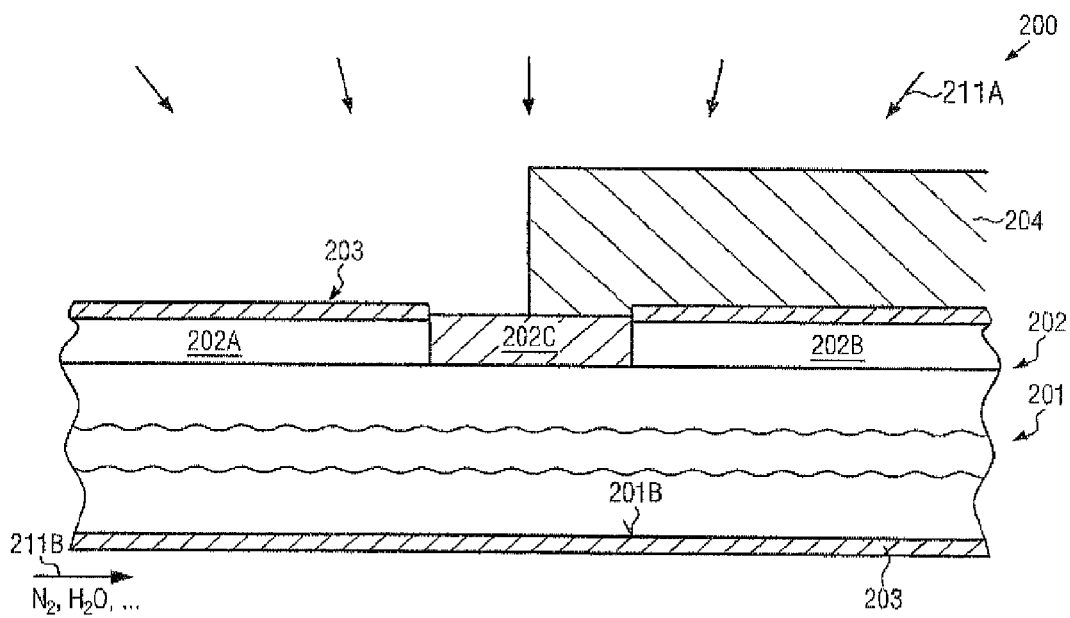

FIG. 2c schematically illustrates the semiconductor device 200 according to further illustrative embodiments in which the mask material 203 may be selectively removed from the active region 202A, while preserving the material above the active region 202B on the basis of the etch mask 204. For this purpose, a wet chemical etch process 211A may be performed, for instance on the basis of hydrofluoric acid, if the mask material 203 is provided in the form of a silicon dioxide material. The etch process 211A may, contrary to conventional strategies as previously described, be performed on the basis of a single wafer process in which the back side 201B of the substrate 201 may be treated differently, as indicated by a purge process 211B, during which any appropriate substantially inert process ambient may be established so as to preserve the mask material 203 above the back side 201B. For example, the back side process ambient 211B may be established by providing a nitrogen flow or by rinsing the material 203 with water and the like. It should be appreciated that such single wafer reactors for wet chemical treatments may typically be available in semiconductor production facilities and may thus be advantageously used for removing the material 203 selectively from the active region 202A. Consequently, also in this case, the further processing may be continued with the mask material 203 still present above the back side 201B.

Figure 2D:
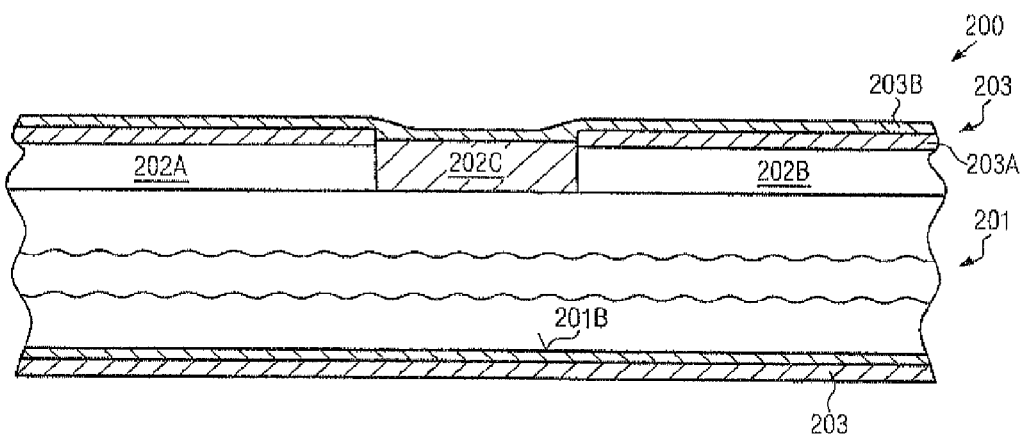

FIG. 2d schematically illustrates the semiconductor device 200 according to still further illustrative embodiments in which the mask material 203 may be provided in the form of two or more distinct sub-layers. In the embodiment shown, a first layer 203A may be provided, for instance, in the form of a silicon dioxide material, followed by a second layer 203B which may be used as a hard mask material for efficiently removing the material 203A selectively from above the active region 202A. For instance, the layer 203B may be provided in the form of a silicon nitride material which may be efficiently deposited on the basis of low pressure CVD techniques, thereby also ensuring a reliable deposition of the material 203B above the back side 201B. It should be appreciated, however, that in other cases any other appropriate material composition of the layers 203A, 203B may be used, depending on the overall process requirements. That is, the material 203A may be selected so as to provide high selectivity during the subsequent selective epitaxial growth process, while the mask layer 203B may provide sufficient etch stop capabilities upon selectively removing the material 203A from above the active region 202A.

Figure 2E:
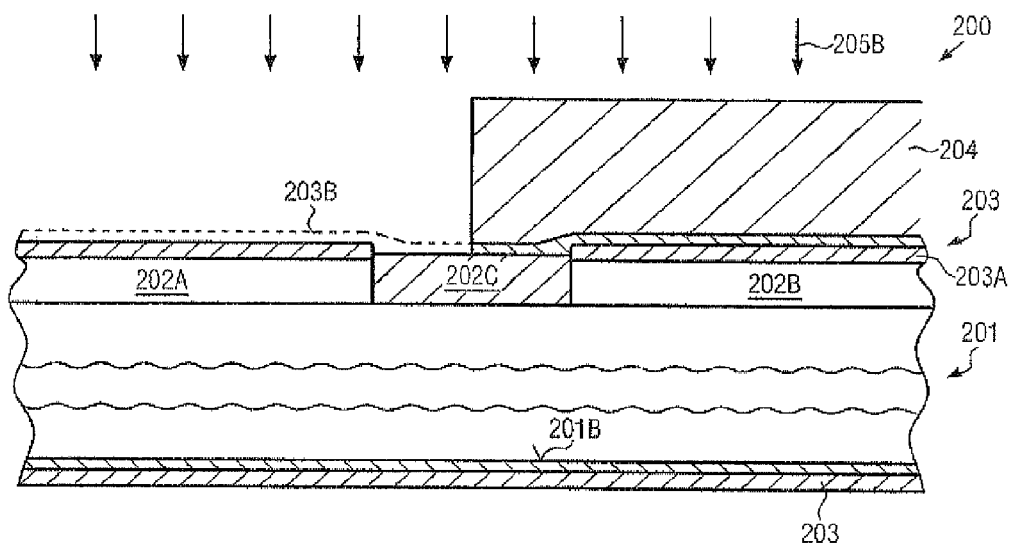

FIG. 2e schematically illustrates the semiconductor device 200 during a plasma assisted etch process 205D, which may be performed on the basis of the etch mask 204 so as to remove the exposed portion of the layer 203B from above the active region 202A while, due to the highly directional nature of the plasma assisted process 205B, the material 203B may also be preserved above the back side 201B. For instance, a plurality of efficient plasma assisted etch recipes for removing silicon nitride material selectively with respect to silicon dioxide are available and may be applied.

Figure 2F:
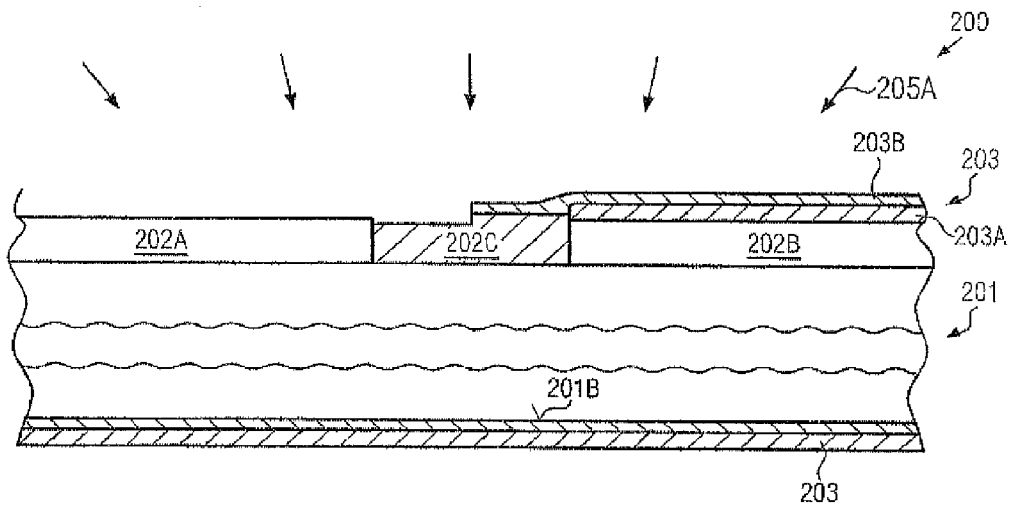

FIG. 2f schematically illustrates the semiconductor device 200 when exposed to a wet chemical etch ambient 205A in order to remove exposed portions of the material 203A. For this purpose, any appropriate wet chemical etch reactor may be employed, for instance based on hydrofluoric acid, hot phosphoric acid and the like, depending on the material composition of the material layer 203A. Furthermore, since the back side 201B may still have formed thereabove the layer 203B, which may act as a hard mask material, a dielectric material may still be reliably provided above the back side 201B. If desired, the etch process 205A may comprise a further wet chemical etch step, for instance based on the chemical for removing the material 203B selectively with respect to the material 203A and to the active region 202A, which may be applied if the selectivity of the material 203B with respect to the subsequent selective epitaxial growth process may be considered inappropriate. In this manner, the selective epitaxial growth process may be established on the basis of the material 203A acting as a growth mask.

Figure 2G:
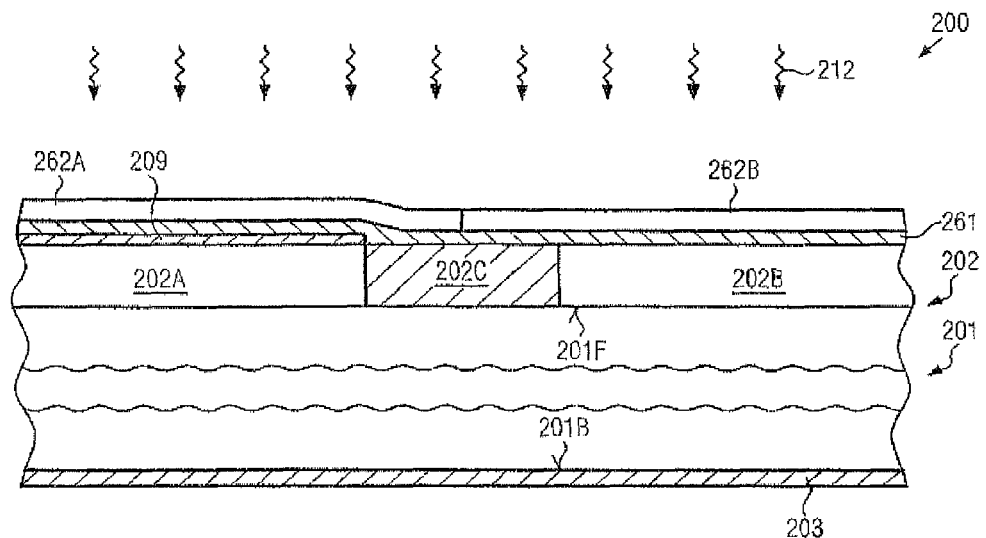

FIG. 2g schematically illustrates the semiconductor device 200 in a further advanced manufacturing stage. As illustrated, a threshold adjusting semiconductor material 209 may be formed on the active region 202A and may thus represent a portion thereof having the desired band gap offset with respect to the material of the initial active region 202A. For example, the material 209 may be comprised of silicon/germanium or any other appropriate alloy, depending on the required band gap offset with respect to the material of the initial active region 202A. Furthermore, a dielectric material 261 may be formed above the active regions 202A, 202B and may comprise a high-k dielectric material, wherein, as previously discussed, a distinct conventional dielectric material, such as silicon dioxide, silicon oxynitride and the like, may be used in combination with the high-k dielectric material, such as hafnium oxide and the like. In other cases, the dielectric material 261 may have any appropriate configuration so as to provide the desired electronic characteristics. Furthermore, metal-containing material layers 262A, 262B may be formed above the active regions 202A, 202B, respectively, and may, for instance, act as a source for diffusing appropriate metal species towards and into the gate dielectric material 261 on the basis of an appropriate heat treatment 212. In other cases, the materials 262A, 262B may represent any appropriate material systems for obtaining desired work function of the gate electrode structures still to be formed without performing the dedicated heat treatment 212.

Moreover, in the embodiment shown, the mask layer 203 may still be present above the back side 201B, while, in other illustrative embodiments, the material 203 may have been removed after forming the material 209.

The semiconductor device 200 as shown in FIG. 2g may be formed in accordance with any appropriate process strategy, as is also previously discussed, for providing the materials 261 and 262A, 262B. It should be appreciated that, typically, a plurality of deposition and patterning processes may be required for providing the materials 262A, 262B in a selective manner, which in turn may require appropriate cleaning processes, wherein, in the embodiment shown, the presence of the mask material 203 may provide superior surface uniformity of the back side 201B. The mask material 203 may be preserved after the selective deposition of the material 209 by removing the mask material 203 selectively from the active region 202B (FIGS. 2b-2f) by applying, for instance, a strategy as discussed above, for instance by using a plasma assisted etch process or by using a wet chemical etch process in which the back side 201B may be treated differently, thereby enabling the preserving of the material 203, if desired. Consequently, any interaction of chemical agents with the back side may result in a more uniform "response" of the back side including the mask material 203 compared to conventional strategies in which a certain amount of the threshold adjusting semiconductor material may be present in a locally strongly varying manner across the back side of the substrate, as previously explained. Consequently, in addition to significant advantages obtained by reducing the probability of creating contamination caused by the presence of a threshold adjusting semiconductor material at the back side, in these embodiments, further processing may be performed on the basis of a back side of superior uniformity, which may thus result in superior uniformity of any heat treatments, such as the treatment 212, since the heat transfer via the substrate back side 201B may be enhanced, while also, generally, the substrate handling may be accomplished with a high degree of uniformity.

Figure 2H:
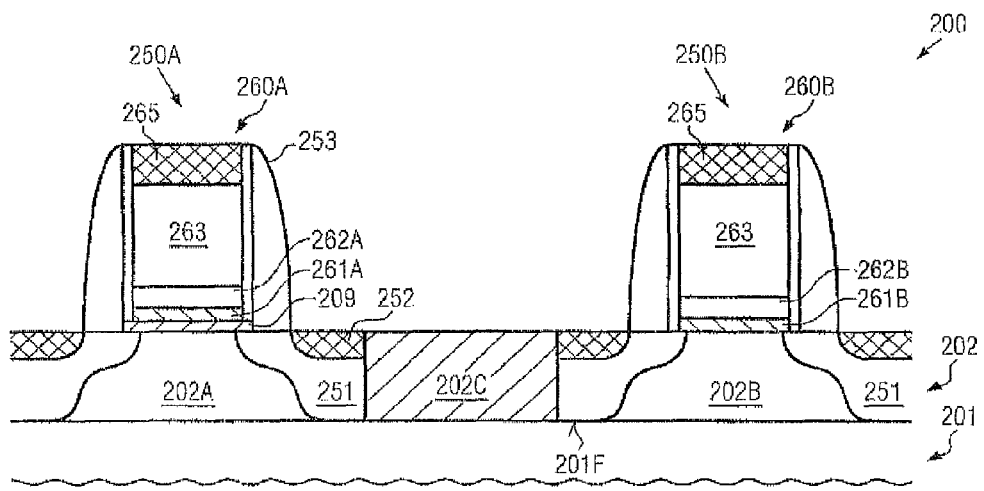

FIG. 2h schematically illustrates the semiconductor device 200 in a further advanced manufacturing stage. As illustrated, a first transistor 250A, such as a P-channel transistor, may be formed in and above the active region 202A and may comprise a gate electrode structure 260A. Similarly, a second transistor 250B, such as an N-channel transistor, may be formed in and above the active region 202B and may comprise a gate electrode structure 260B. The transistors 250A, 250B may comprise drain and source regions 251, possibly in combination with metal silicide regions 252, while a spacer structure 253 may also be formed on sidewalls of the gate electrode structures 260A, 260B, respectively.

As previously explained with reference to the semiconductor device 100, the gate electrode structure 260A may comprise a gate dielectric material 261A, which may comprise the material 261 of FIG. 2g as a base material, possibly in combination with any additional work function adjusting metal species, followed by a metal-containing electrode material 262A, such as titanium nitride and the like, possibly also including other metal species for adjusting the work function, as is also previously discussed. Similarly, the gate electrode structure 260B may comprise the gate dielectric layer 261B, possibly including a work function adjusting metal species, in combination with the metal-containing electrode material 262B. Furthermore, a further electrode material 263, such as silicon and the like, may be provided, possibly in combination with a metal silicide material 265.

The semiconductor device 200 as illustrated in FIG. 2h may be formed on the basis of any appropriate process strategy. That is, the gate electrode structures 260A, 260B may be formed on the basis of the configuration as shown in FIG. 2g or any other appropriate strategy, for instance by depositing the material 263, for instance in combination with any other materials, as is, for instance, also described with reference to the device 100. After patterning the resulting layer stack, the drain and source regions 251 may be formed in combination with the spacer structure 253, followed by the formation of the metal silicide regions 252 and 265, after any high temperature anneal processes for activating dopants and curing implantation-induced damage.

Consequently, sophisticated high-k metal gate electrode structures may be formed on the basis of a process technique in which the work function of the gate electrode structures 260A, 260B may be adjusted on the basis of the threshold adjusting material 209, wherein any disadvantageous influence of this material and the associated selective epitaxial growth process may be reduced during the further processing. It should be appreciated that, if desired, the electrode material 263 may be replaced in a later manufacturing stage, for instance by a highly conductive metal, such as aluminum and the like.

As a result, the present disclosure provides manufacturing techniques in which sophisticated high-k metal gate electrode structures may be formed on the basis of a threshold adjusting semiconductor alloy, which may be provided on the basis of a selective epitaxial growth process. The deposition of any threshold adjusting semiconductor material at the back side may be suppressed or at least strongly reduced by providing and preserving a mask material at the back side at least during the selective epitaxial growth process. In some illustrative embodiments, the mask material may even be preserved during further processes prior to the patterning of the gate electrode structure, thereby enhancing overall process uniformity by avoiding undue substrate and tool contamination and by preserving a superior back side uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a mask layer above first and second active regions of a substrate and above a back side of the substrate;

removing said mask layer selectively from said first active region while preserving said mask layer above said second active region and said back side;

forming a threshold adjusting semiconductor alloy selectively on said first active region while using said preserved mask layer as a mask;

removing said mask layer at least from said second active region; and forming a first gate electrode structure on said threshold adjusting semiconductor alloy formed on said first active region and forming a second gate electrode structure on said second active region.

2. The method of claim 1, wherein forming said mask layer comprises forming an oxide layer.

3. The method of claim 1, wherein forming said mask layer comprises depositing at least a portion of said mask layer.

4. The method of claim 1, wherein removing said mask layer selectively from above said first active region comprises performing a plasma assisted etch process.

5. The method of claim 1, wherein removing said mask layer selectively from above said first active region comprises performing a wet chemical etch process while masking said second active region and purging said back side with an inert substance.

6. The method of claim 1, comprising forming a P-channel transistor comprising the first gate electrode structure.

7. The method of claim 2, wherein forming said mask layer further comprises forming a hard mask layer above said oxide layer.

8. The method of claim 7, wherein removing said mask layer selectively from above said first active region comprises removing said hard mask layer above said first active region by performing a plasma assisted etch process while masking said second active region, and removing said oxide layer by performing a wet chemical etch process while using preserved portions of said hard mask layer as an etch mask.

9. The method of claim 4, wherein removing said mask layer selectively from above said first active region further comprises performing a wet chemical etch process.

10. A method, comprising:
forming an oxide layer above a first active region and a second active region of a semiconductor device, said first and second active regions being formed above a substrate of said semiconductor device;

removing said oxide layer selectively from above said first active region by exposure to a reactive etch ambient while masking said oxide layer above said second active region and avoiding exposure of a back side of said substrate to said reactive etch ambient;

forming a threshold adjusting semiconductor alloy on said first active region while using said oxide layer above said second active region as a mask;

removing said oxide layer from above said second active region; and forming a first gate electrode structure on said threshold adjusting semiconductor alloy formed on said first active region and forming a second gate electrode structure on said second active region.

11. The method of claim 10, wherein removing said oxide layer selectively above said first active region comprises performing a plasma assisted etch process.

12. The method of claim 10, wherein removing said oxide layer selectively above said first active region comprises performing a wet chemical etch process.

13. The method of claim 10, further comprising forming a hard mask layer above said first and second active regions and above said back side and selectively removing said hard mask layer from above said first active region so as to expose said oxide layer formed above said first active region.

14. The method of claim 10, wherein forming said first and second gate electrode structures comprises adjusting a work function in said first and second gate electrode structures and wherein said method further comprises forming drain and source regions after adjusting the work function of said first and second gate electrode structures.

15. The method of claim 12, wherein performing said wet chemical etch process comprises purging said back side with an inert substance so as to preserve an oxide material formed on said back side.

16. The method of claim 13, wherein said mask layer comprises silicon and nitrogen.

17. The method of claim 13, wherein removing said hard mask layer from above said first active region comprises performing a plasma assisted etch process.

18. A method, comprising:
providing a semiconductor region formed above a front side of a substrate, said substrate having a back side arranged oppositely to said front side;

forming a mask layer above said semiconductor region and above said back side;

removing said mask layer selectively from said semiconductor region and preserving at least a portion of said mask layer above said back side so as to cover said back side;

forming a semiconductor alloy selectively on said semiconductor region while using said at least a portion of said mask layer as a growth mask; and forming a gate electrode structure on said semiconductor alloy.

19. The method of claim 18, wherein forming said mask layer comprises forming an oxide layer.

20. The method of claim 18, wherein forming said mask layer comprises forming a silicon nitride material.

* * * * *